United States Patent [19]

Rosenthal

[11] Patent Number: 4,567,361

[45] Date of Patent: Jan. 28, 1986

[54] RETICLE BAR CODE AND METHOD AND APPARATUS FOR READING SAME

[75] Inventor: David Rosenthal, Lexington, Mass.

[73] Assignee: GCA Corporation, Bedford, Mass.

[21] Appl. No.: 496,819

[22] Filed: May 23, 1983

[51] Int. Cl.⁴ .............................................. G06K 7/10
[52] U.S. Cl. .................................... 235/462; 235/385; 235/463
[58] Field of Search ........................ 235/385, 462, 463

[56] References Cited

U.S. PATENT DOCUMENTS 3,987,278 10/1976 Van Elzakker et al. ........ 235/462 X
4,059,224 11/1977 Seligman ............................. 235/462

OTHER PUBLICATIONS

"Bar Code Symbology"; David C. Allais; Intermec; Feb. 16, 1982, 42 pages.

Primary Examiner—David L. Trafton
Attorney, Agent, or Firm—Henry D. Pahl, Jr.

[57] ABSTRACT

In the reticle bar code scheme disclosed herein, the peculiar characteristics and requirements of a microlithographic reticle are utilized in a bar code scheme which provides multiple levels of error checking while permitting an extensive repertoire of reticle identifying characters. In reading the bar code, the reticle is moved passed a photoelectric sensor and, by counting a clock signal, the width of each bar is measured. A synchronization character at the start of the data character string provides a nominal bar width value and each character comprises three bars of each polarity, the bars being integral multiples of the nominal value with the width of the character being ten times the nominal value.

3 Claims, 6 Drawing Figures

RETICLE BAR CODE AND METHOD AND APPARATUS FOR READING SAME

BACKGROUND OF THE INVENTION

The present invention relates to a bar code for microlithographic reticles and more particularly, to a reticle identifying scheme which provides multiple levels of error checking.

In the manufacture of integrated circuit semiconductor devices, patterns are generated on the surface of a semiconductor substrate through a process which is known generally as microlithography. Typically the desired pattern is formed initially on a plate referred to as a reticle, e.g., the pattern is formed by photolithographically etching a layer of chrome on a glass substrate or carrier. Increasingly, the pattern on the reticle is projected at reduced scale onto the surface of the wafer although older systems often employed so-called contact or proximity printing. As multiple reticles may be used in the successive steps of manufacturing a given semiconductor device and there are many types of such devices, it is important that the reticles be carefully checked and identified prior to usage since the use of an incorrect reticle could destroy an entire run of semiconductor wafers which have already been subject to extensive earlier processing.

While it has previously been proposed to employ bar codes for identifying reticles, the codes used heretofore have been relatively simple and limited codes, and have neither utilized the unique characteristics of the reticle environment nor have they provided the exceptionally high degree of reliability which is desirable in automated semiconductor manufacturing lines.

As is understood by those skilled in the art, most bar code symbologies developed heretofore have been most concerned with the ability to read rapidly codes printed by common printing techniques. Among the problems encountered in such an environment are the tendency of inks to run and to accumulate. The ability to achieve an initial read was considered important in the design of such codes and significant, i.e. non-trivial error rates were typically acceptable. In keeping with these criteria, most bar codes employed relatively narrow ranges of bar widths and little or no error correcting capability.

In the case of the reticles used in semiconductor manufacturing, however, a converse situation exists. The images created by the chrome on glass etching process are typically of very high resolution and precision and also yield a high degree of contrast. The need of the system, i.e., the semiconductor manufacturing line, is also dissimilar in that any error at all can entail immense cost, since the use of an incorrect mask to process a run of partially manufactured semiconductor wafers would render useless and valueless the entire work product.

Among the several objects of the present invention may be noted the provision of a reticle bar code system of extremely high reliability; the provision of such a system in which provides several levels of error-checking; the provision of such a system which permits identifying a reticle at the point of usage of a reticle; the provision of such a system which permits the reading of bar code from a moving reticle; the provision of such a system which is highly flexible in operation; and the provision of such a system which is of relatively simple and inexpensive construction. Other objects and features will be in part apparent and in part pointed out hereinafter.

SUMMARY OF THE INVENTION

Briefly, a microlithographic reticle constructed in accordance with the present invention carries along one side a bar code representing a succession of characters identifying the pattern on the reticle. The bar code includes, at each end thereof, a quiet zone and, adjacent each quiet zone, a synchronization block comprising a series of predetermined length of bars of equal nominal width and of alternating polarity. Adjacent each synchronization block is a preselected terminator character which is distinct from any of the identifying characters. The identifying characters occupy the space between the terminating characters and each comprises three bars of each polarity, the width of each bar being an integral multiple of the nominal width, with each character being ten times the nominal width.

In the preferred method of reading the bar code, the transitions in bar polarity are photoelectrically sensed and cycles of a clock signal are counted between successive transitions. When a predetermined series of successive counts are similar in value so as to constitute a synchronization block, that nominal value is stored as representing a nominal bar width and the reading of characters is then initiated. For each character, the number of nominal widths which are of a predetermined polarity are determined and an error indication is generated if this number does not agree with a predetermined parity. Preferably, one of the characters is a check character which provides a reference check value which can then be compared with a trial check value generated from all other characters in the code, an error indication being generated if the trial check value and the reference check values do not agree.

BRIEF DESCRIPTION OF THE DRAWINGS

FIGS. 3 and 4 illustrate the bar code font used in accordance with the practice of the present invention.

Corresponding references characters indicate corresponding parts throughout the several views of the drawings.

DESCRIPTION OF THE PREFERRED EMBODIMENT

Figure 1:
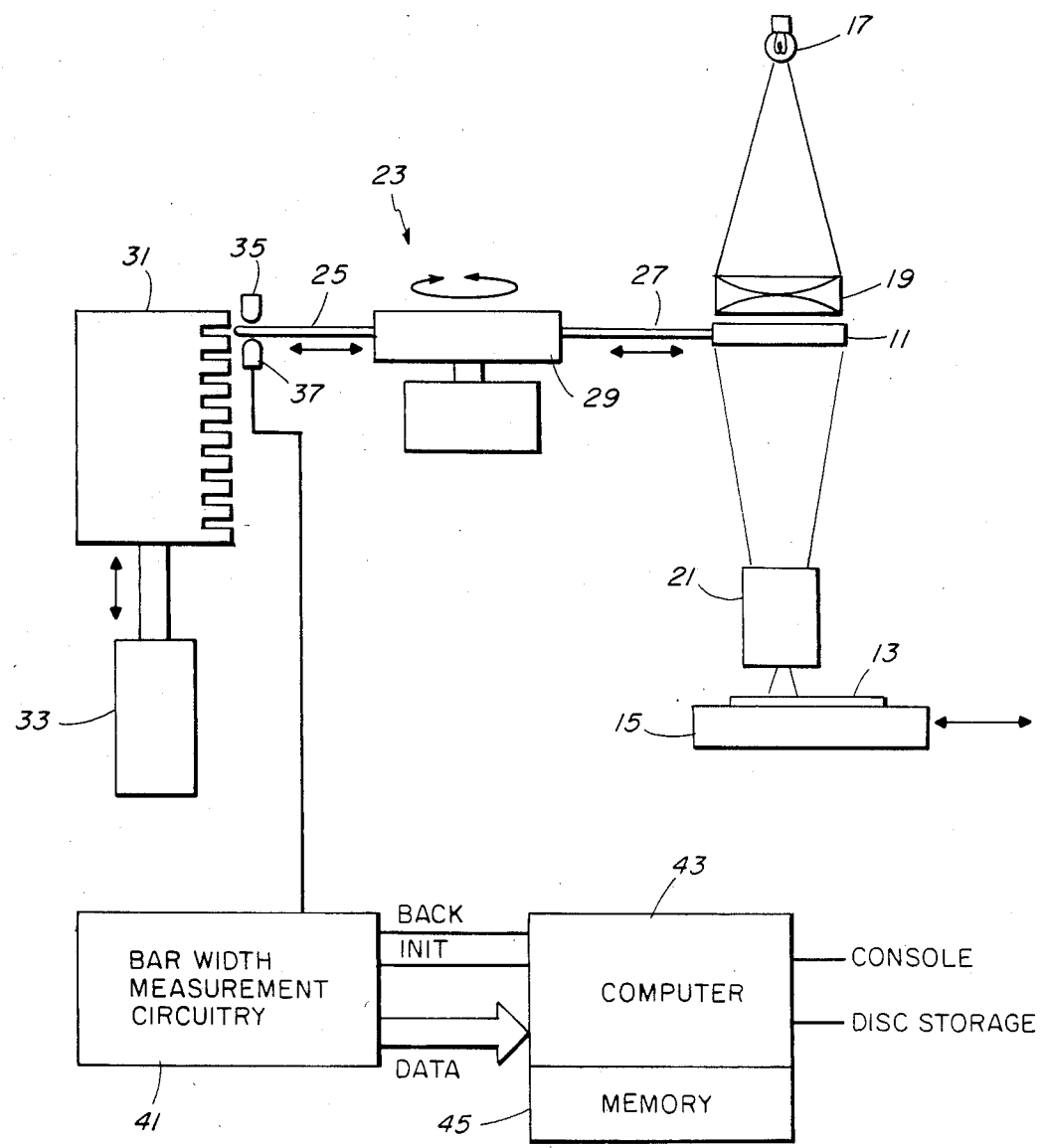
FIG. 1 is a diagramatic illustration of microlithographic apparatus of the type employed in integrated circuit manufacture employing a bar code reticle identifying scheme in accordance with the present invention.

Referring now to FIG. 1, the apparatus illustrated there is functional, in general terms, to project an image of a reticle, designated generally by a reference character 11 onto the surface of a semiconductor wafer, designated generally by a reference character 13. The wafer is typically coated with a photosensitive resist. The apparatus illustrated is generally of the type known as a step and repeat camera in which the wafer is moved stepwise on X-Y table, designated generally by a reference character 15, while repeated exposures are made on the surface of the wafer. In making each exposure, light from the source, designated generally by a reference character 17, is directed through the reticle 11 by means of a condenser lens 19, with the image of the pattern on the reticle being formed on the wafer surface by a very high resolution lens assembly 21.

In order to permit different patterns to be projected, the microlithographic apparatus is provided with a reticle changer, designated generally by a reference character 23. Reticle changer 23 comprises a pair of reciprocable fork-like reticle holders 25 and 27 which are mounted on a rotatable changer assembly 29. Any one of a plurality of reticles are selectively positioned in vertical alignment with the changer 23 by means of a magazine 31 which is positionable by means of an elevator mechanism 33.

In operation, one of the fork-like holders 25 and 27 withdraws a wafter from a selected slot in the magazine 31 and then the assembly 29 rotates so that the holder can insert the reticle into the projection column for exposing the wafer. Typically, during the same operation, a previously used reticle is removed from the column by the other of the fork-like reticle holders and is returned to its respective slot in the magazine 31. As is understood by those skilled in the art, these several motions are typically controlled and coordinated by means of a supervisory computer system in present state-of-the-art semiconductor manufacturing systems. While, in theory, such systems should be able to perfectly track and catalog each reticle once the system is properly set up, practice has shown that it is highly advisable to provide a reticle identification scheme which determines the identity of each reticle just prior to its utilization in the system.

In the embodiment illustrated, a light source 35 is positioned to shine through the reticle as it is withdrawn from a magazine and a photodetector 37 is provided for sensing the intensity of the light transmitted through the bar code. While this sensor detection system is shown on the magazine side of the reticle changer, it should be understood that it could likewise be located on the side of the reticle changer adjacent the projection column.

As will be understood by those skilled in the art, the source 35 and photodetector provide a means for detecting changes in polarity in the bar code. In the example shown, transmissive areas are considered to be of one polarity and opaque areas to be of the other polarity. If the source and detector were on the same side, the two polarities might be defined as reflective and absorbtive. As is explained in greater detail hereinafter, it is not significant as to which polarity is which (binary "one" or binary "zero") since the system depends almost solely on the timing of polarity transitions rather than upon absolute polarity.

As the reticle is withdrawn from the magazine, the widths of the individual bars making up the bar code are measured by circuitry indicated generally by reference character 41. Measurements taken by the special purpose circuitry 41 are provided, through a handshaking scheme described in greater detail hereinafter, to a general purpose computer designated generally by reference character 43. As is understood by those skilled in the art, computer 43 typically includes random access memory 45 in which process variables may be stored on a transient basis and also connections to an operator console through which overall system commands may be received and to disk storage devices through which programs and data may be loaded and processed records may be stored on a long term basis.

Figure 5:
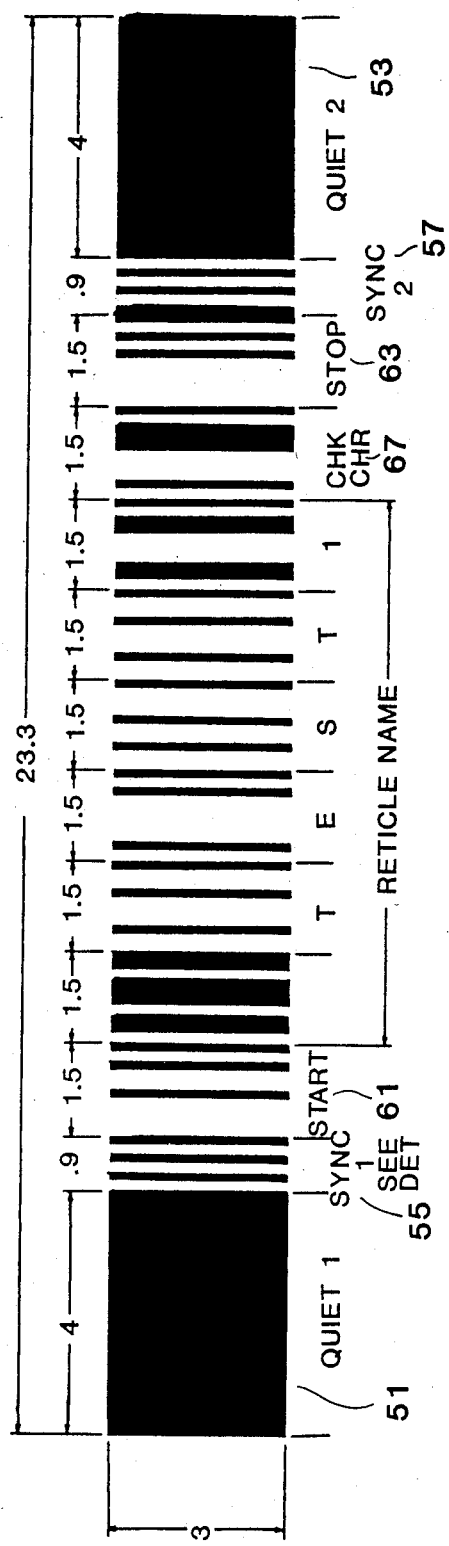
FIG. 5 represents an example of a bar code in accordance with the present invention.

The font utilized in accordance with the practice of the present invention is uniquely constructed to take advantage of the accurate image quality available on the reticle while providing the multiple levels of error checking to effect a high degree of immunity from errors. An overall bar code strip is shown in FIG. 5. As is understood, such a strip is provided along one edge of the normally square reticle plate, i.e., to one side of the electronic device pattern which the code is intended to identify. With reference to FIG. 5, the code includes, at each end, a quiet zone. These are designated by reference characters 51 and 53. Adjacent each quiet zone is a synchronization blocks 55 and 57 respectively. Synchronization blocks 55 and 57 are symmetrical and each comprises three bars of each polarity, the bars being of unit or nominal width. As may be seen, these blocks are symmetrical and thereby facilitate the reading of the code in either direction. As is described in greater detail hereinafter, the synchronization blocks are utilized to establish the nominal width or time which each bar of unit width takes to traverse the photoelectric sensor 37.

Between the synchronization blocks are a plurality of character cells. Each character cell is ten units wide and contains three bars of each polarity. Further, each cell begins with a bar of a first predetermined polarity and ends with a bar of the opposite polarity. The bar code is thus of the type conventionally referred to as continuous in that intercharacter spacing must conform to the same constraints as spacings within the character cell. However, in the context of the microlithographic reticle, this constraint is not the least onerous owing to the high precision with which such reticles are characteristically formed.

This scheme imposes certain limitations on the character codes which may be utilized and these restrictions will, as is understood by those skilled in the art, in effect provide redundancy aiding in the error checking. In particular, it may be shown that each character must have at least one bar of two unit widths or greater and that no bar can be greater than five unit widths. The code does, however, allow this five to one ratio of bar widths. Unlike most other codes, though, this high ratio is entirely acceptable given the very high resolution of the images available on reticles utilized in semiconductor manufacturing.

In accordance with the practice of the present invention, the character codes utilized also conform to the constraint that, within each character, the number of unit bar widths which are of a given polarity conform to a predetermined parity. Accordingly, within each character cell a second level of error detection is available, i.e., a parity check as well as the requirement that there be three bars of each polarity.

Figure 3:
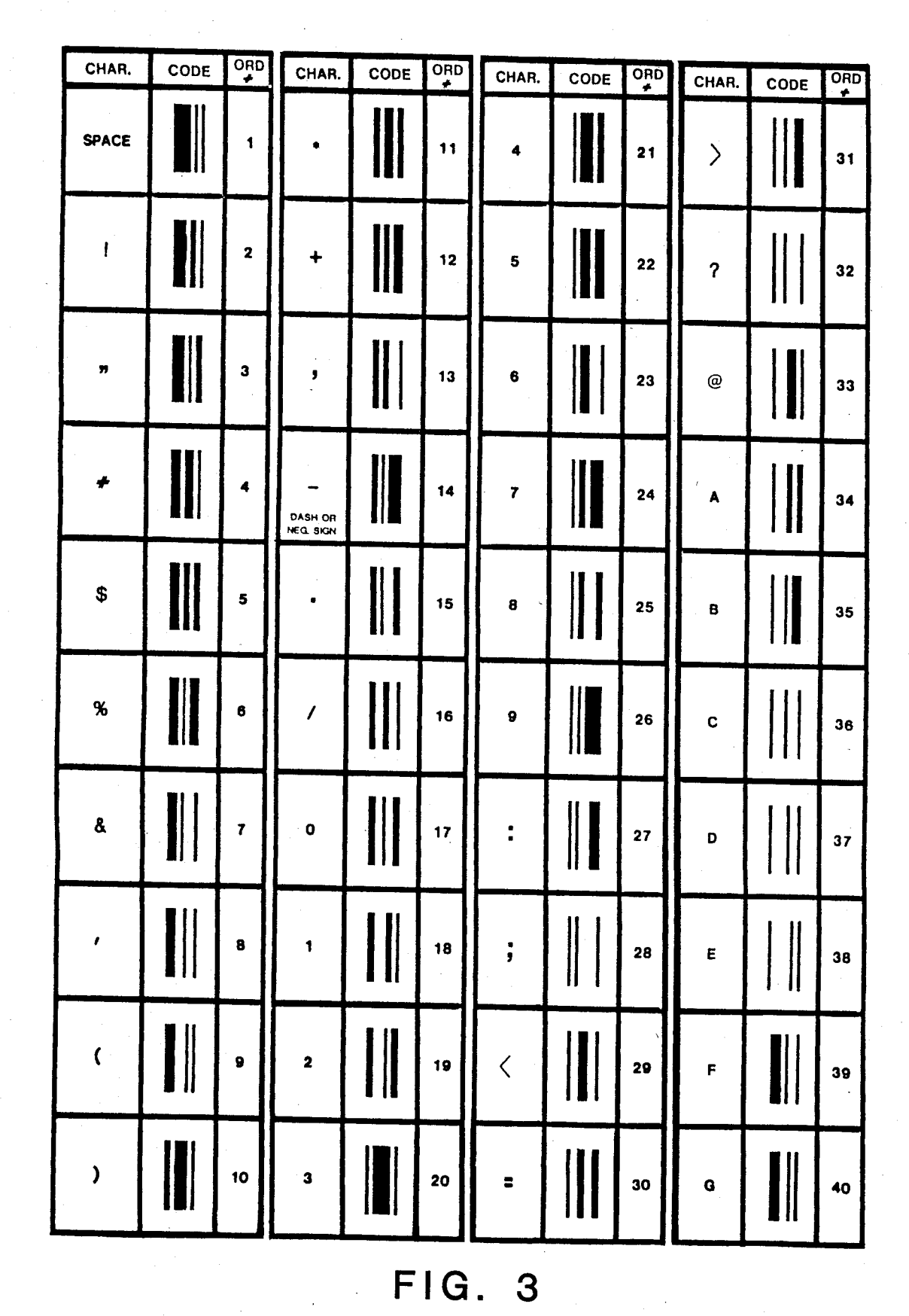
Figure 4:
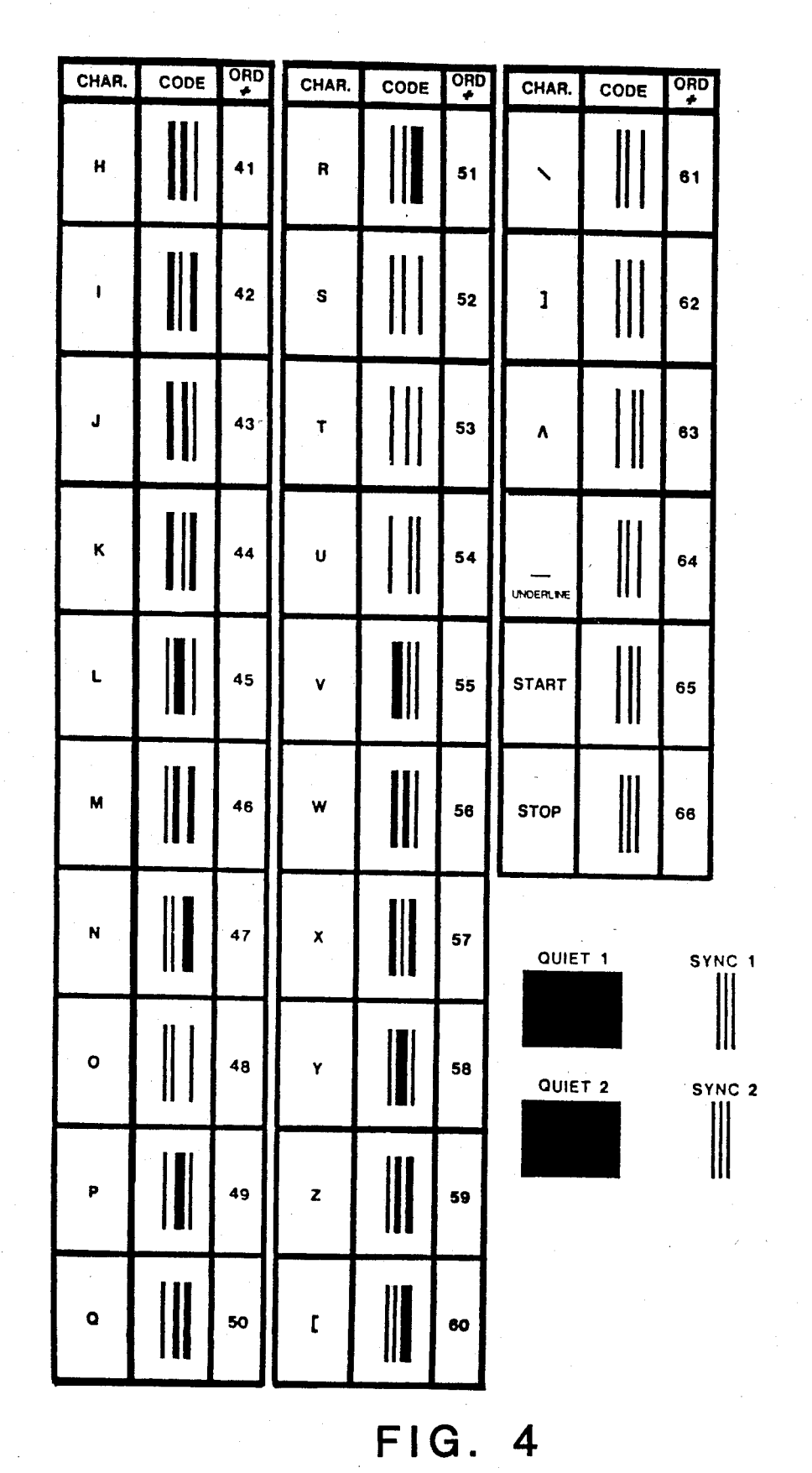

Notwithstanding this degree of error checking inherent within each character cell, the bar code of the present invention provides a relatively extensive character set which the semiconductor manufacturer can utilize for identifying each reticle in his inventory. In fact, a complete alphanumeric set is available, as illustrated in FIGS. 3 and 4. Although this set comprises a complete alphanumeric set, lower cases letters are not provided for as would be necessary to make a full ASCII set.

In addition to the characters which actually identify the pattern on the reticle, the character set also includes unique start and stop characters. These terminator characters are designated by reference numbers 61 and 63 in the bar code shown in FIG. 5. A final form of character used in the overall code is also include a check character, designated by reference number 67 in FIG. 5. This character represents a reference check value equal to a trial check value which can be calculated or generated from all the other characters in the pattern identifying code. In the particular scheme employed in the embodiment illustrated, the binary values corresponding to all the pattern identifying characters are summed and then divided by the radix of 64. The remainder is then taken as the trial check value. As is understood, the computer 43 can independently calculate the trial check value and if it does not agree with the reference check value, an error indication is generated.

Figure 2A:
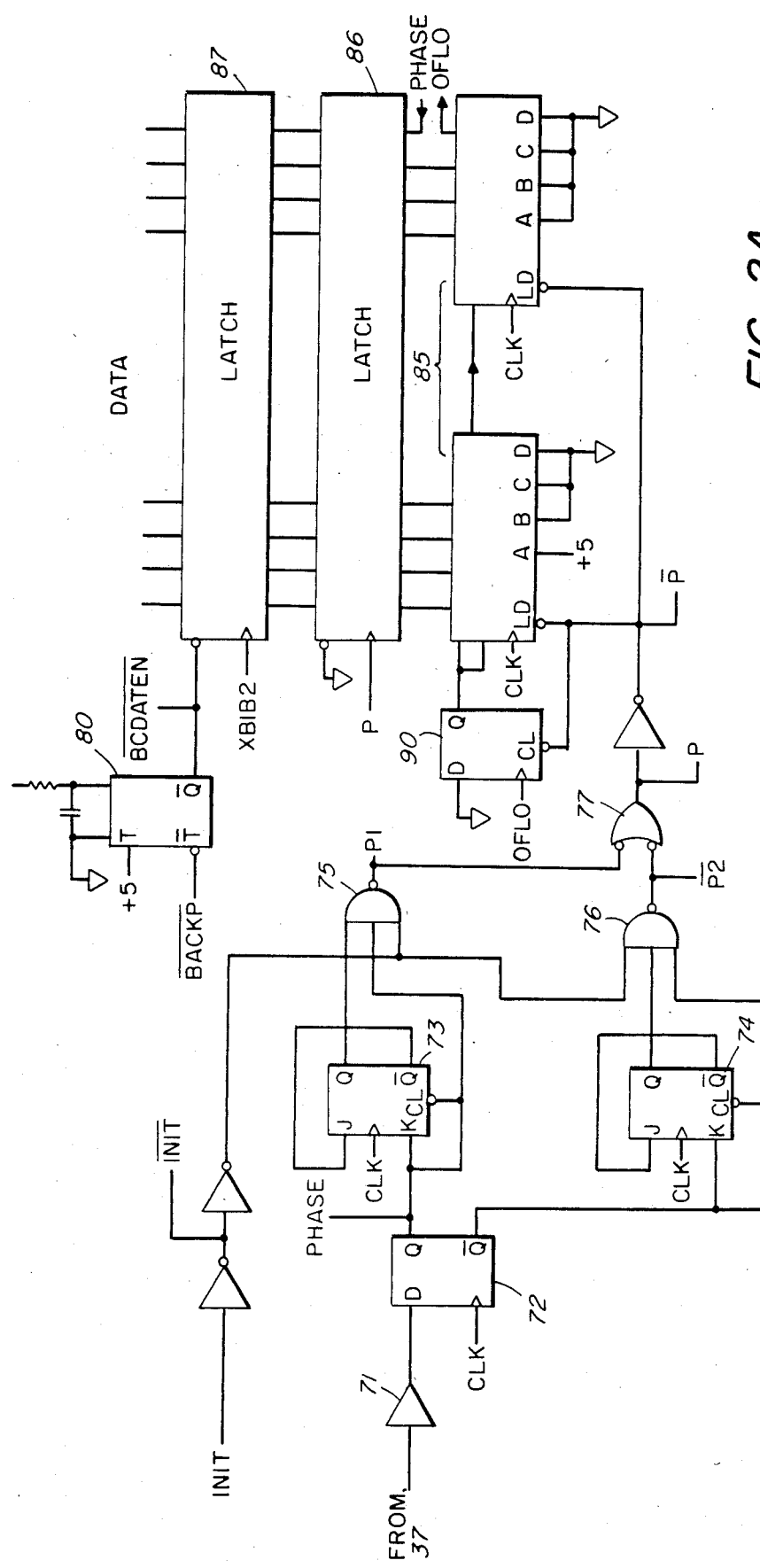
FIGS. 2A and 2B together form a circuit diagram of bar width measurement circuitry employed in the apparatus of FIG. 1.
Figure 2B:
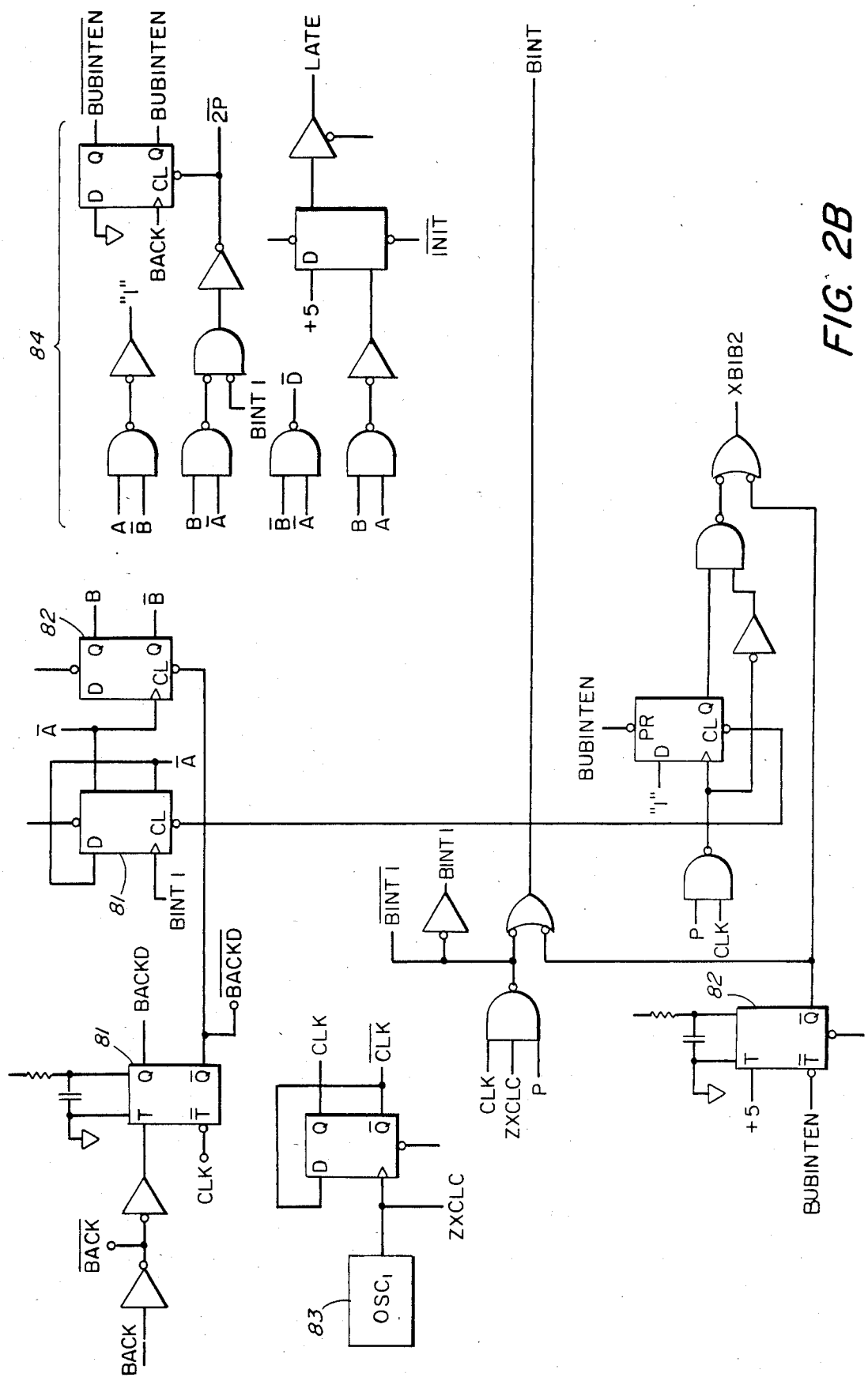

The actual circuitry employed for bar width measurements is illustrated in FIGS. 2A and 2B. This diagram illustrates the circuitry in some detail and, in general, appropriate integrated circuit components for fulfilling the various logic functions will be apparent to those skilled in the art, e.g., J-K flipflops may be of the standard type 74LS107; D-type flip flops may be of the standard 74LS74 type and so on. The one shot multivibrator indicated at reference characters 80, 81 and 82 may be of type 74LS123. The more complex circuit components used are specifically identified hereinafter in the descriptive text.

While the various internal signals are consistently labeled so that the detailed operation of this circuitry may be analyzed by those skilled in the art, the following overall description of operation may be useful for understanding the manner in which this circuitry facilitates the utilization of character recognition algorithms in accordance with the practice of the present invention.

In general, it may be noted that clock pulses, derived from a stable oscillator 83 (FIG. 2B) are counted, in a counter 85 (FIG. 2A), to time the interval between transitions as sensed by the detector 37. Counts obtained by the counter 85 are doubled buffered, e.g., by successive latch circuits as indicated at 86 and 87 before being provided to the interface with the computer. Counter 85 may, for example, comprise a pair of cascaded 74LS163 integrated circuits while each of the latches 86 and 87 may comprise a type 74LS373 device.

The signal from the photodetector 37 is applied, through a level trigger 71 to a data acquisition and synchronization circuit comprising a D-type flip flop 72 and a pair of JK flip flops 73 and 74. The signals obtained from the JK flip flops 73 and 74 are combined along with the signals derived from the INIT signal provided by the computer in NAND gates 75 and 76 and NAND gate 77 to yield the signal which controls the enabling of the counter 85.

In the embodiment illustrated, the counter 85 comprises eight stages, i.e. the data is essentially byte wide, and the frequency of the clock oscillator is chosen in relation to the speed of movement of the reticle so that the counter will not overflow in the reading of a bar of any normal width, e.g. up to five units wide, but will overflow during reading of the quiet zones. It is, for example, appropriate that a bar of single unit width correspond to twenty counts of the clock. The OFLO (overflow) signal from the counter 85 is employed, in a D-type flip flop 90 to control the advancing of the counter 85 so that the counter stops at a value of 127 during the traversing of a quiet zone. A reading of 127 thus uniquely identifies a quiet zone.

In general, the circuitry of FIG. 2 comprises a state machine in which the flip flops 81 and 82 (FIG. 2B) constitute a program counter and the collection of gates designated generally by reference character 84 comprise a program decoder for generating the various internal control signals identified in the drawing. This state machine provides the following handshaking with the computer so as to permit the computer to obtain and store bar width measurements generated successively by the bar width measurement circuitry 41.

The signal BINT is an interrupt signal generated by the timing circuitry to signal to the computer that a width value (DATA) is ready. BINT is enabled by the computer through the signal INIT. When BINT is issued, the computer, unless untowardly occupied with other matters, responds with the signal BACK.

BACK loads the parallel interface of the computer with the contents of latch 87 and enables the next BINT to transfer the contents of latch 86 to latch 87.

If BACK does not occur before the second BINT:
(a) The transfer from latch 86 to latch 87 is inhibited to save the contents of latch 87 long enough to be read by the next BACK.
(b) The falling edge of BACK then causes the immediate generation of another BINT, enabling the transfer from latch 86 to latch 87 before the value in the counter is transferred to latch 86. This transfer otherwise takes place on change of data along with BINT.

If BACK does not occur before the third BINT, a LATE flag is set and remains set until BINT is reenabled on a later try. The data (character intervals) will be missing one or more intervals. If only one is missing, reliable error recovery may be possible in software. In any event, an error condition is signalled.

By storing the successive bar width values in an appropriate array, the computer 43 can then utilize the nominal width value derived from the synchronization block to recognize the successive characters making up the overall bar code. Error signals are issued if either the unique start character or the unique stop character are missing, if any of the characters does not comply with the parity requirement implicit in the predetermined font, or if the check value given by the check character does not match a check value calculated independently from the read value of the other characters in the code.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. A reticle carrying a pattern for the microlithographic manufacture of integrated circuit devices having along one side thereof a bar code of light and dark bars including a succession of identifier characters identifying the pattern, said light and dark bars representing opposite polarities, said bar code comprising:
   at each end of said code, a quiet zone being a dark bar of a width greater than the maximum allowable width of a bar;
   adjacent each quiet zone, a synchronization block comprising a series of predetermined length of bars of equal nominal width and of alternating polarity;

adjacent one synchronization block, a preselected start character which is a terminator character distinct from any of said identifier characters;

adjacent the other synchronization block, a preselected stop character which is a terminator character distinct from any of said identifier characters;

between said terminator characters, a succession of identifier characters, each of said characters comprising three bars of each polarity, the width of each bar being an integral multiple of said nominal width, each character being ten times said nominal width, the number of width units of a given polarity in each character conforms to a preselected parity; and adjacent said stop terminator characters, a check character, said check character having a value which is a function of the value of all the identifier characters.

2. The method of reading a bar code of light and dark bars on a moving reticle, said light and dark bars representing opposite polarities, said method comprising:

providing a clock signal;

illuminating the bar code and photoelectrically sensing light/dark transitios;

recognizing a quiet zone which is a dark bar of a width greater than the maximum allowable width of a bar, said quiet zone indicating a beginning of a bar code;

counting cycles of said clock signal and storing the count number occurring between successive transitions;

when a predetermined series of successive counts are similar in value, thereby constituting a synchronization block, storing a nominal value representing the nominal transition interval and initiating the reading of characters in which each character interval is ten times the nominal interval and each character comprises three transitions of each polarity;

for each character, determining the number of nominal intervals which are a predeterminating polarity and generating an error indication if this number does not agree with a predetermined parity;

generating an error indication if the first character does not agree with a preselected start character;

comparing each character with a preselected stop character and, when such a stop character is detected, reading the value of the adjacent character as a reference check value;

generating from all other characters in the code of trial check value; and, generating an error indication if said trial check value and reference check value do not agree.

3. The method as set forth in claim 2 further comprising:

comparing the nominal value of a final succession of intervals, constituting a second synchronization block, with the previously stored nominal value and providing a possible error indication if the difference exceeds a predetermined value.

* * * * *